United States Patent
Won

(10) Patent No.: US 8,710,594 B2
(45) Date of Patent: Apr. 29, 2014

(54) INTEGRATED CIRCUIT DEVICES HAVING CONDUCTIVE STRUCTURES WITH DIFFERENT CROSS SECTIONS

(75) Inventor: Dae-Joong Won, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 84 days.

(21) Appl. No.: 13/355,957

(22) Filed: Jan. 23, 2012

(65) Prior Publication Data

US 2012/0119365 A1  May 17, 2012

Related U.S. Application Data

(63) Continuation of application No. 12/628,543, filed on Dec. 1, 2009, now Pat. No. 8,124,512.

(30) Foreign Application Priority Data

Dec. 10, 2008 (KR) ................................ 2008-125137

(51) Int. Cl.
*H01L 23/52* (2006.01)
(52) U.S. Cl.
USPC ........................................... 257/388; 257/392
(58) Field of Classification Search
USPC ................... 257/388, 392, E23.141
See application file for complete search history.

(56) References Cited

U.S. PATENT DOCUMENTS

| 6,518,106 | B2 | 2/2003 | Ngai et al. | 438/157 |
| 6,855,641 | B2 | 2/2005 | Ryu et al. | 438/767 |
| 7,314,789 | B2 | 1/2008 | Cabral et al. | 438/197 |
| 7,323,420 | B2 | 1/2008 | Kim et al. | 438/723 |
| 7,955,937 | B2 | 6/2011 | Wieczorek et al. | 438/311 |
| 8,021,936 | B2 | 9/2011 | Noguchi et al. | 438/149 |
| 2008/0261360 | A1 * | 10/2008 | Jung et al. | 438/199 |

FOREIGN PATENT DOCUMENTS

| KR | 10-0384774 | 5/2003 |
| KR | 1020070051964 A | 5/2007 |
| KR | 1020070066023 A | 6/2007 |

* cited by examiner

*Primary Examiner* — Savitr Mulpuri
(74) *Attorney, Agent, or Firm* — Myers Bigel Sibley & Sajovec, PA

(57) ABSTRACT

A semiconductor device includes a first conductive structure and a second conductive structure. The first conductive structure is formed in a first region of a substrate, and includes a first polysilicon layer pattern, a first conductive layer pattern having a resistance smaller than that of the first polysilicon layer pattern, and a first hard mask. The second conductive structure is formed in a second region of the substrate and has a thickness substantially the same as that of the first conductive structure. The second conductive structure includes a second polysilicon layer pattern, a second conductive layer pattern having a resistance smaller than that of the second polysilicon layer pattern and having a thickness different from that of the first conductive layer pattern, and a second hard mask.

11 Claims, 9 Drawing Sheets

INTEGRATED CIRCUIT DEVICES HAVING CONDUCTIVE STRUCTURES WITH DIFFERENT CROSS SECTIONS

REFERENCE TO PRIORITY APPLICATIONS

This application is a continuation of U.S. patent application Ser. No. 12/628,543, filed Dec. 1, 2009, now U.S. Pat. No. 8,124,512, which claims priority to Korean Patent Application No. 2008-0125137, filed Dec. 10, 2008, the contents of which are hereby incorporated herein by reference.

FIELD

The present invention relates to semiconductor devices and methods of manufacturing the same.

BACKGROUND

Semiconductor devices include transistors having gate electrodes and source/drain regions. As semiconductor devices become more highly integrated, the gate electrodes become smaller in size, especially in width, however, the gate electrodes need to have low resistance. Forming gate electrodes having small width but low resistance is challenging.

SUMMARY

Methods of forming integrated circuit devices according to embodiments of the present invention include forming a first electrically conductive layer on a substrate. This step may be preceded by a step of forming a gate insulating layer on the substrate, with the first electrically conductive layer being deposited directly on the gate insulating layer. In some of these embodiments, the first electrically conductive layer may be a doped polysilicon layer and the substrate may be a semiconductor substrate. A selective removal step is then performed to remove a portion of an upper surface of the first electrically conductive layer. This removal step yields a first portion of the first electrically conductive layer having a first thickness and a second portion of the first electrically conductive layer having a second thickness greater than the first thickness. A second electrically conductive layer having a nonuniform thickness is formed on the first and second portions of the first electrically conductive layer. The first portion of the second electrically conductive layer and the first portion of first electrically conductive layer are selectively etched in sequence to define a first electrically conductive gate electrode extending opposite a first portion of the substrate. Similarly, a second portion of the second electrically conductive layer and the second portion of the first electrically conductive layer are selectively etched in sequence to define a second electrically conductive gate electrode extending opposite a second portion of the substrate. Notwithstanding the differences in thickness of the first electrically conductive layer, the first electrically conductive gate electrode is formed to have an equivalent thickness to the second electrically conductive gate electrode.

According to additional embodiments of the invention, the step of forming a second electrically conductive layer may include depositing a second electrically conductive layer on the first and second portions of the first electrically conductive layer, and then planarizing the second electrically conductive layer to define a planarized second electrically conductive layer having a nonuniform thickness. Moreover, selectively etching a first portion of the second electrically conductive layer and the first portion of first electrically conductive layer in sequence may be performed concurrently with selectively etching a second portion of the second electrically conductive layer and the second portion of the first electrically conductive layer in sequence.

According to still further embodiments of the invention, processing steps are performed so that a first ratio of a thickness of the first portion of the second electrically conductive layer relative to a thickness of the first portion of the first electrically conductive layer in the first electrically conductive gate electrode is greater than a second ratio of a thickness of the second portion of the second electrically conductive layer relative to a thickness a thickness of a second portion of the first electrically conductive layer in the second electrically conductive gate electrode. This difference in ratios may be used advantageously to specially configure gate electrodes for memory cell transistors having relatively small dimensions and configure gate electrodes for peripheral logic (e.g., NMOS and PMOS logic transistors) having relatively large dimensions. In particular, the conductivity of the second electrically conductive layer may be greater than a conductivity of the first electrically conductive layer so that a relatively small dimension gate electrode may have relatively low resistance characteristics.

According to still further embodiments of the invention, a method of forming an integrated circuit device includes forming a first electrically conductive layer on a substrate and then selectively removing a portion of an upper surface of the first electrically conductive layer to thereby define a first portion of the first electrically conductive layer having a first thickness and a second portion of the first electrically conductive layer having a second thickness greater than the first thickness. A second electrically conductive layer having a nonuniform surface profile is then formed on the first and second portions of the first electrically conductive layer. This second electrically conductive layer is planarized for a sufficient duration to expose the second portion of the first electrically conductive layer. Thereafter, a first portion of the second electrically conductive layer and the first portion of first electrically conductive layer are selectively etched in sequence to define a first electrically conductive gate electrode extending opposite a first portion of the substrate. In addition, the second portion of the first electrically conductive layer is selectively etched to define a second electrically conductive gate electrode extending opposite a second portion of the substrate. The first electrically conductive gate electrode may have an equivalent thickness to the second electrically conductive gate electrode. Moreover, the first electrically conductive gate electrode may be a gate electrode of a memory cell transistor and the second electrically conductive gate electrode may be a gate electrode of a transistor within a peripheral circuit region of the substrate extending adjacent a memory cell region of the substrate that comprises the memory cell transistor.

DETAILED DESCRIPTION OF THE EMBODIMENTS

Figure 1:
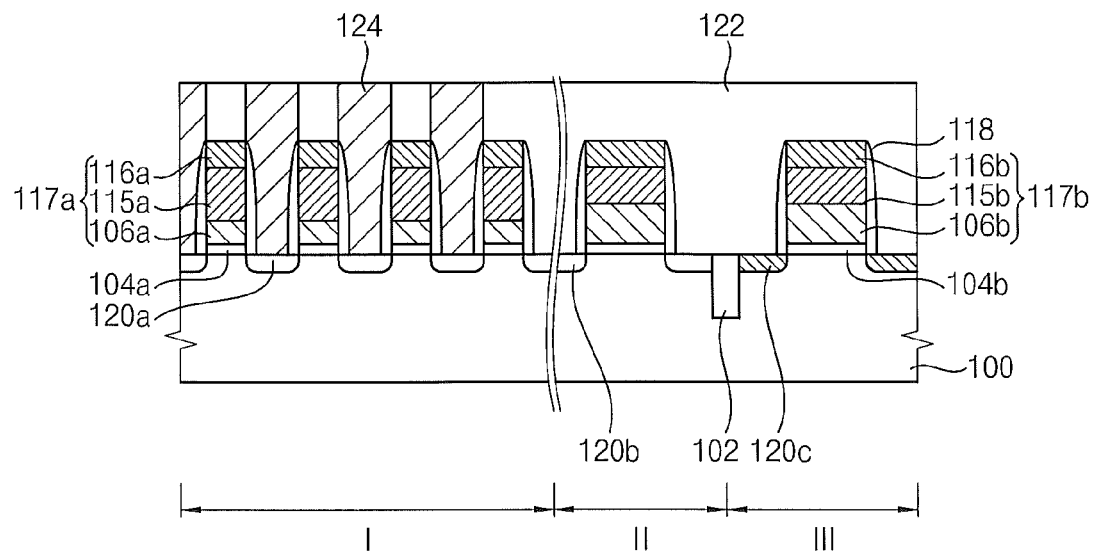
FIG. 1 is a cross-sectional view illustrating a semiconductor device in accordance with example embodiments.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

FIG. 1 is a cross-sectional view illustrating a semiconductor device in accordance with example embodiments.

Referring to FIG. 1, a substrate 100 divided into a first region I, a second region II and a third region III may be provided. The substrate 100 may include a silicon substrate, a germanium substrate, a silicon-germanium substrate, a silicon-on-insulator (SOI) substrate, a germanium-on-insulator (GOI) substrate, etc. In the present embodiment, the substrate 100 includes a silicon substrate. The first region I may serve as a cell region and the second and third regions II and III may serve as a peripheral region, respectively. Further, the second region II may serve as an n-type metal-oxide-semiconductor (NMOS) region, and the third region III may serve as a p-type metal-oxide-semiconductor (PMOS) region.

Cell transistors may be formed in the first region I of the substrate 100. In example embodiments, the cell transistors may be NMOS transistors. Logic transistors may be formed in the second and third regions II and III of the substrate 100. Particularly, NMOS logic transistors may be formed in the second region II and PMOS logic transistors may be formed in the third region III.

Each of the cell transistors may include a first gate insulation layer 104*a*, a first conductive structure 117*a* and a first impurity region 120*a*.

The first gate insulation layer 104*a* may include silicon oxide, which may be formed by thermally oxidizing a top surface of the substrate 100.

The first conductive structure 117*a* may be formed on the first gate insulation layer 104*a*. The first conductive structure 117*a* may include a first polysilicon layer pattern 106*a*, a first conductive layer pattern 115a and a first mask 116a sequentially stacked on the first gate insulation layer 104a.

The first polysilicon layer pattern 106a may be doped with n-type impurities. The first conductive layer pattern 115a may include a material having a resistance lower than that of the first polysilicon layer pattern 106a. The first conductive layer pattern 115a may include a metal, a metal silicide, a metal nitride, etc. For example, the first conductive layer pattern 115a may include tungsten, titanium, tantalum, tungsten silicide, titanium silicide, tantalum silicide, cobalt silicide, nickel silicide, tungsten nitride, titanium nitride, tantalum nitride, etc. These may be used alone or in combination thereof. In the present embodiment, the first conductive layer pattern 115a includes tungsten silicide that has a good adhesion and a low resistance.

The first conductive layer pattern 115a may decrease the total resistance of the first conductive structure 117a, and thus the cell transistors may have an increased operation speed. That is, when the first conductive layer pattern 115a has a relatively large thickness with respect to the first polysilicon layer pattern 106a, the first conductive structure 117a may have a reduced resistance.

The first mask 116a may include silicon nitride.

Each of the logic transistors in the second region II, that is, each of the NMOS logic transistors may include a second gate insulation layer 104b, a second conductive structure 117b and a second source/drain region 120b. Each of the logic transistors in the third region III, that is, each of the PMOS logic transistors may include a second gate insulation layer 104b, a second conductive structure 117b and a third source/drain region 120c.

The second gate insulation layer 104b may include silicon oxide, which may be formed by thermally oxidizing a top surface of the substrate 100.

The second conductive structure 117b may be formed on the second gate insulation layer 104b. The second conductive structure 117b may include a second polysilicon layer pattern 106b, a second conductive layer pattern 115b and a second mask 116b sequentially stacked on the second gate insulation layer 104b. The second conductive structure 117b may have a width larger than that of the first conductive structure 117a. The second conductive structure 117b may have a thickness substantially the same as that of the first conductive structure 117a.

A part of the second polysilicon layer pattern 106b in the second region II may be doped with n-type impurities, and a part of the second polysilicon layer pattern 106b in the third region III may be doped with p-type impurities. For example, the n-type impurities may include arsenic, phosphorous, and the p-type impurities may include boron.

The second polysilicon layer pattern 106b may have a thickness larger than that of the first polysilicon layer pattern 106a. The second polysilicon layer pattern 106b may have a thickness at which p-type impurities may not diffuse to the substrate 100.

The second conductive layer pattern 115b may include a material substantially the same as that of the first conductive layer pattern 115a. In the present embodiment, the second conductive layer pattern 115b includes tungsten silicide.

The second conductive layer pattern 115b may have a thickness smaller than that of the first conductive layer pattern 115a so that the first and second conductive structures 117a and 117b may have substantially the same thickness, even though the second polysilicon layer pattern 106b has a thickness larger than that of the first polysilicon layer pattern 115a. Thus, the second conductive layer pattern 115b may have a top surface having a height substantially the same as that of the first conductive layer pattern 115a. The second conductive structure 117b may have a width larger than that of the first conductive structure 117a, and thus the second conductive structure 117b may not have a resistance lower than that of the first conductive structure 117a.

The second mask 116b may include silicon nitride. In example embodiments, the second mask 116b may have a top surface having a height substantially the same as that of the first mask 116a.

The first impurity region 120a may be formed at upper portions of the substrate 100 adjacent to the first conductive structure 117a. The first impurity region 120a may be doped with n-type impurities. The second impurity region 120b may be formed at upper portions of the substrate 100 adjacent to the second conductive structure 117b in the second region II. The second impurity region 120b may be doped with n-type impurities. The third impurity region 120c may be formed at upper portions of the substrate 100 adjacent to the second conductive structure 117b in the third region III. The third impurity region 120c may be doped with p-type impurities.

Spacers 118 may be formed on sidewalls of the first conductive structure 117a and the first gate insulation layer 104a. The spacers 118 may be also formed on sidewalls of the second conductive structure 117b and the second gate insulation layer 104b.

An insulating interlayer 122 covering the cell transistors and the logic transistors may be formed on the substrate 100. Contact plugs 124 contacting the first impurity region 120a may be formed through the insulating interlayer 122 in the first region I.

As illustrated above, the first conductive structure 117a with a relatively small width may have substantially the same thickness as that of the second conductive structure 117b with a relatively large width. Additionally, the first conductive layer pattern 115a of the first conductive structure 117a may have a thickness larger than that of the second conductive layer pattern 115b of the second conductive structure 117b.

Thus, the first conductive structure 117a having the small width may have a reduced resistance by increasing the thickness of the first conductive layer pattern 115a therein without increasing the total thickness of the first conductive structure 117a.

FIGS. 2 to 12 are cross-sectional views illustrating a method of manufacturing a semiconductor device in accordance with example embodiments.

Figure 2:
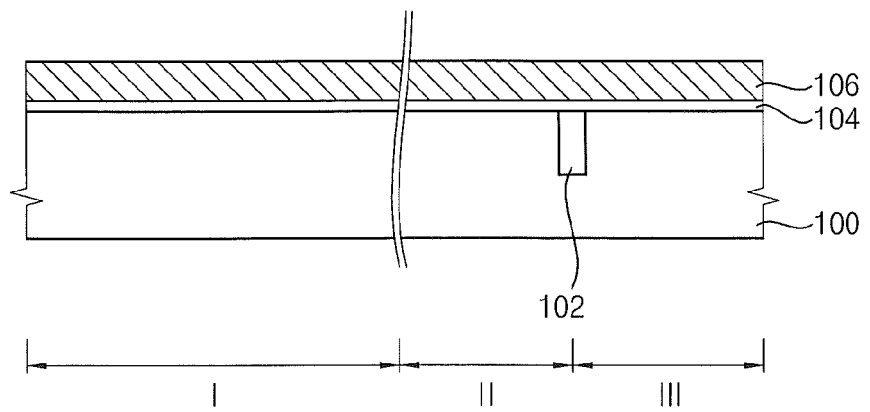
FIGS. 2 to 12 are cross-sectional views illustrating a method of manufacturing a semiconductor device in accordance with example embodiments.

Referring to FIG. 2, a substrate 100 divided into a first region I, a second region II and a third region III may be provided. The first region I may serve as a cell region and the second and third regions II and III may serve as a peripheral region, respectively. Further, the second region II may serve as an NMOS region, and the third region III may serve as a PMOS region.

An isolation layer 102 may be formed on the substrate 100 by an isolation process to define an active region and a field region. P-type impurities may be doped into the first and second regions I and II of the substrate 100, and n-type impurities may be doped into the third region III of the substrate 100.

A gate insulation layer 104 may be formed on the substrate 100. The gate insulation layer 104 may be formed using silicon oxide. In example embodiments, the gate insulation layer 104 may be formed by thermally oxidizing a top surface of the substrate 100. A polysilicon layer 106 may be formed on the gate insulation layer 104. The polysilicon layer 106 may be formed by a chemical vapor deposition (CVD) process. N-type impurities may be implanted into the polysilicon layer 106 when the polysilicon layer 106 is formed.

Figure 3:
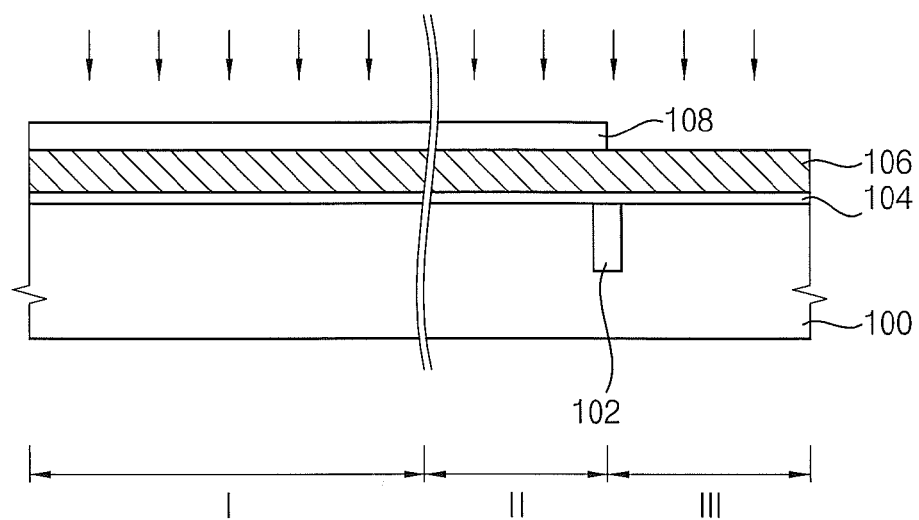

Referring to FIG. 3, n-type impurities may be implanted into the polysilicon layer 106 until the polysilicon layer 106 may have a desired Fermi level, which is proper for NMOS transistors, if the n-type impurities have not been implanted into the polysilicon layer 106 when the polysilicon layer 106 is formed.

A first photoresist pattern 108 may be formed on the polysilicon layer 106. The first photoresist pattern 108 may cover the polysilicon layer 106 in the first and second regions I and II. P-type impurities may be implanted into the polysilicon layer 106 in the third region III using the first photoresist pattern 108 as an ion implantation mask. As a result, portions of the polysilicon layer 106 in the first and second regions I and II may be doped with n-type impurities, and a portion of the polysilicon layer 106 in the third region III may be doped with p-type impurities. The first photoresist pattern 108 may be removed by an ashing process and/or a stripping process.

Figure 4:
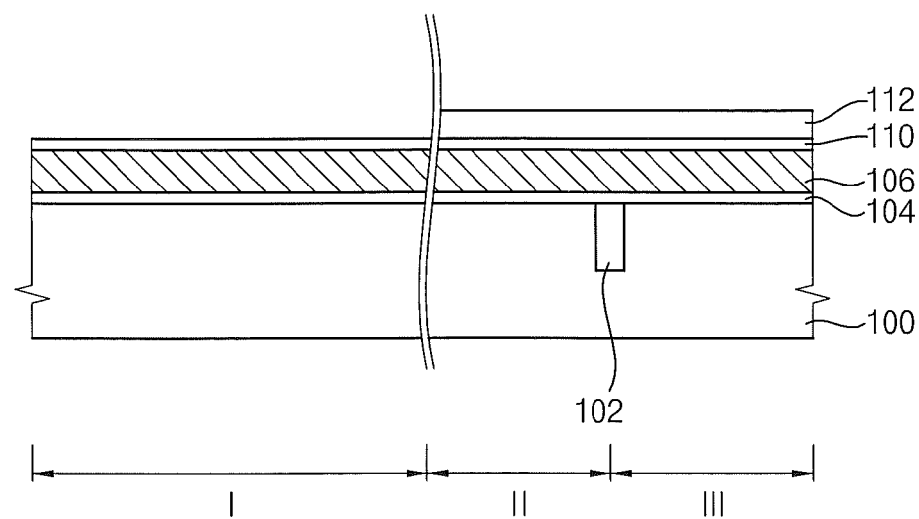

Referring to FIG. 4, a buffer layer 110 may be formed on the polysilicon layer 106. The buffer layer 110 may be formed using an oxide by a CVD process. Alternatively, the buffer layer 110 may be formed by oxidizing a top surface of the polysilicon layer 106. The buffer layer 110 may prevent a second photoresist pattern 112 subsequently formed from directly contacting the polysilicon layer 106. However, the buffer layer 110 may not be formed for the brevity of process.

The second photoresist pattern 112 may be formed on the buffer layer 110. The second photoresist pattern 112 may cover the buffer layer 110 in the second and third regions II and III.

Figure 5:
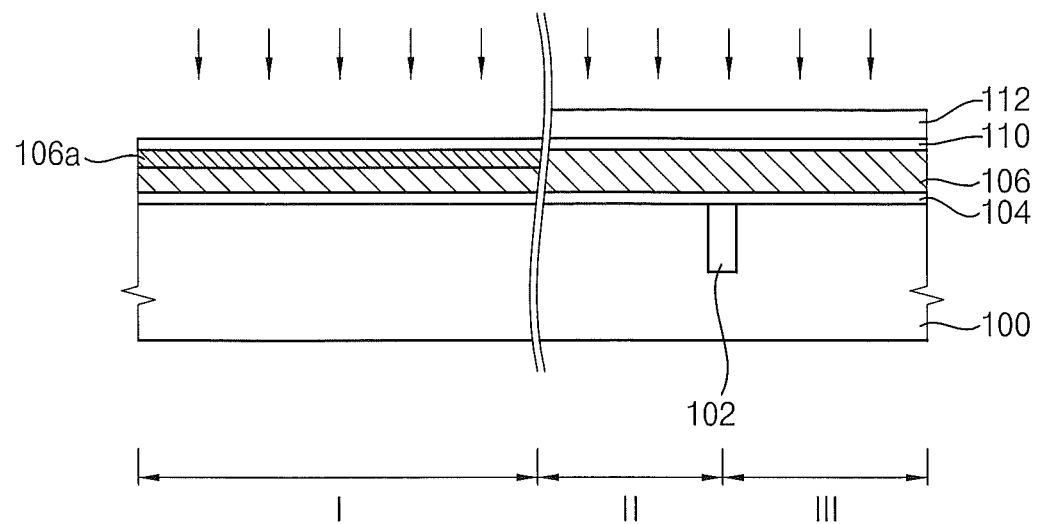

Referring to FIG. 5, n-type impurities may be implanted into the polysilicon layer 106 in the first region I using the second photoresist pattern 112 as an ion implantation mask. An upper portion of the polysilicon layer 106 in the first region I may be damaged by impurity ions implanted therein while the implantation process is performed. Thus, the damaged upper portion of the polysilicon layer 106 may be easily removed by a cleaning process or an etching process subsequently performed.

If the n-type impurities are more deeply implanted into the polysilicon layer 106, the portion of the polysilicon layer 106 removed in the subsequent cleaning or etching process may be larger. Thus, the thick difference between a portion of the polysilicon layer 106 in the first region I and portions thereof in the second and third regions II and III may be increased.

Figure 6:
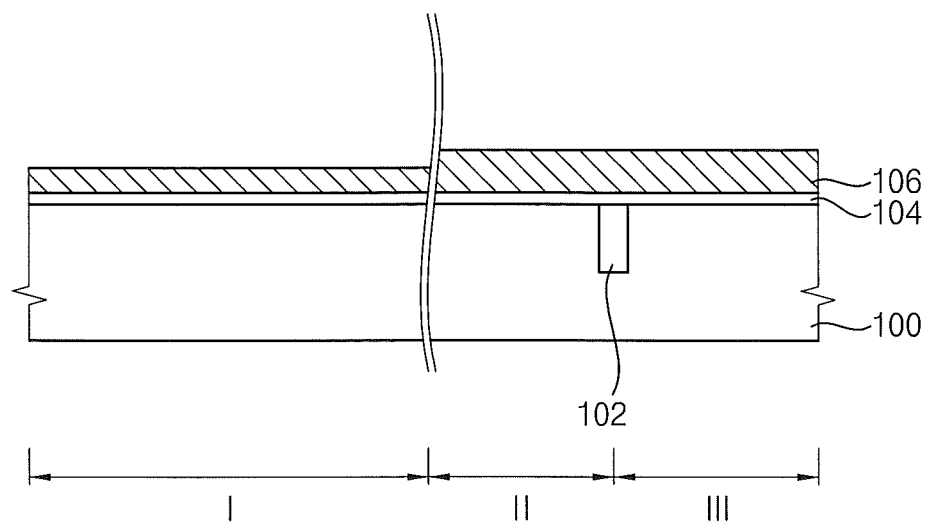

Referring to FIG. 6, the second photoresist pattern 112 may be removed by an ashing process and/or a stripping process. The buffer layer 110 may be removed by a wet etching process. When the buffer layer 110 is removed, particles generated in the ashing process and/or the stripping process may be also removed. Additionally, the damaged portion of the polysilicon layer 110 may be removed in the wet etching process. Thus, the portion of the polysilicon layer 106 in the first region I may have a thickness smaller than that of the portions thereof in the second and third regions II and III.

Figure 7:
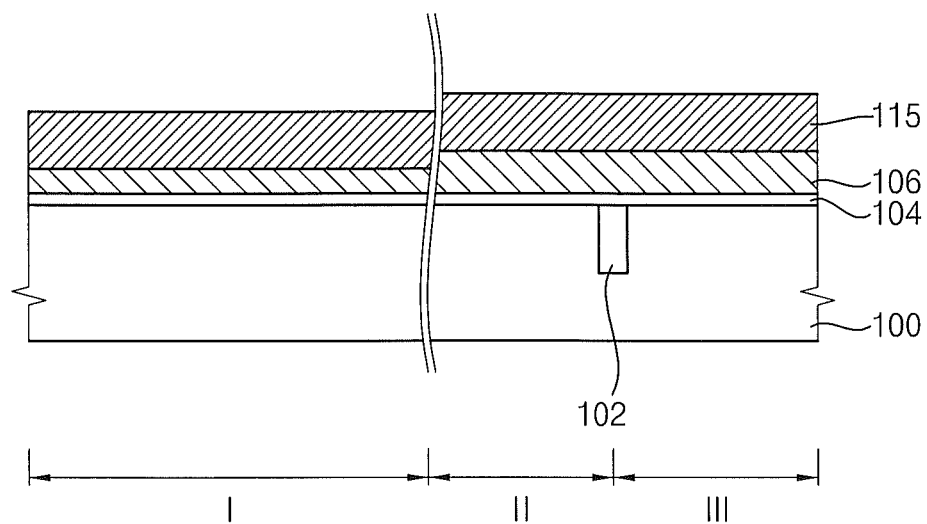

Referring to FIG. 7, a conductive layer 115 may be formed on the polysilicon layer 106 using a material having a resistance lower than that of the polysilicon layer 106. The conductive layer 115 may be formed using a metal, a metal silicide, a metal nitride, etc. For example, the conductive layer 115 may be formed using tungsten, titanium, tantalum, tungsten silicide, titanium silicide, tantalum silicide, cobalt silicide, nickel silicide, tungsten nitride, titanium nitride, tantalum nitride, etc. These may be used alone or in combination thereof. In the present embodiment, the conductive layer 115 is formed using tungsten silicide that has a good adhesion and a low resistance.

A top surface of the conductive layer 115 in the first region I may be lower than that of the conductive layer 115 in the second and third regions II and III, however, may be higher than that of the polysilicon layer 106 in the second and third regions II and III.

Figure 8:
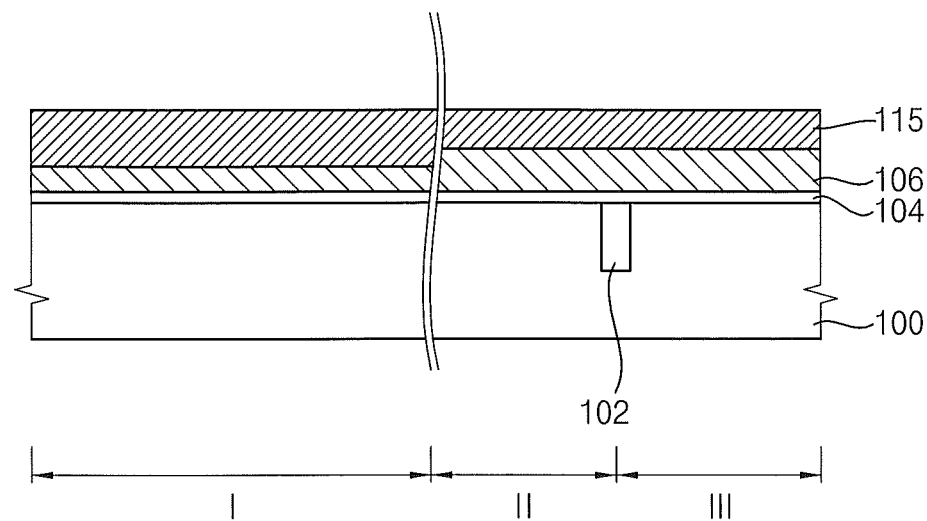

Referring to FIG. 8, an upper portion of the conductive layer 115 may be planarized by a chemical mechanical polishing (CMP) process and/or an etch back process. Thus, a portion of the conductive layer 115 in the first region I may have a thickness larger than that of portions of the conductive layer 115 in the second and third regions II and III.

Figure 9:
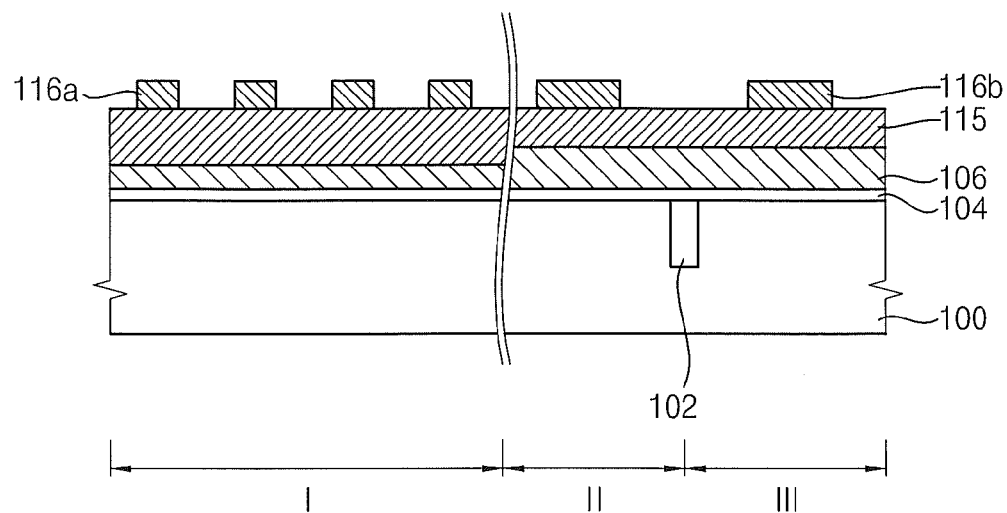

Referring to FIG. 9, a hard mask layer may be formed on the conductive layer 115. The hard mask layer may be formed by a CVD process using a nitride.

A third photoresist pattern (not shown) may be formed on the hard mask layer. Parts of the third photoresist pattern in the first region I may have a width smaller than that of parts thereof in the second and third regions II and III.

The hard mask layer may be patterned by the third photoresist pattern to form a first hard mask 116a in the first region I and a second hard mask 116b in the second and third regions II and III. The third photoresist pattern may be removed.

Figure 10:
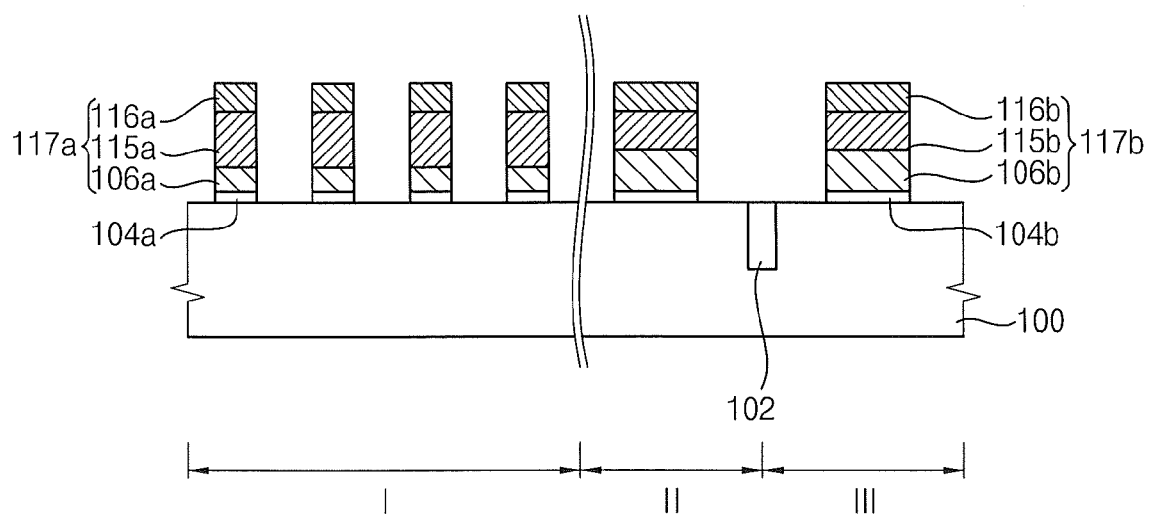

Referring to FIG. 10, the conductive layer 115, the polysilicon layer 106 and the gate insulation layer 104 may be patterned by an anisotropic etching process using the first and second hard masks 116a and 116b as an etching mask to form a first gate insulation layer pattern 104a and a first conductive structure 117a in the first region I and a second gate insulation layer pattern 104b and a second conductive structure 117b in the second and third regions II and III. The first conductive structure 117a may include a first polysilicon layer pattern 106a, a first conductive layer pattern 115a and the first hard mask 116a sequentially stacked on the first gate insulation layer pattern 104a. The second conductive structure 117b may include a second polysilicon layer pattern 106b, a second conductive layer pattern 115b and a second hard mask 116b sequentially stacked on the second gate insulation layer pattern 104b.

The first polysilicon layer pattern 106a may have a thickness smaller than that of the second polysilicon layer pattern 106b. The first conductive layer pattern 115a may have a thickness larger than that of the second conductive layer pattern 115b. The first conductive structure 117a may have a thickness substantially the same as that of the second conductive structure 117b.

Figure 11:
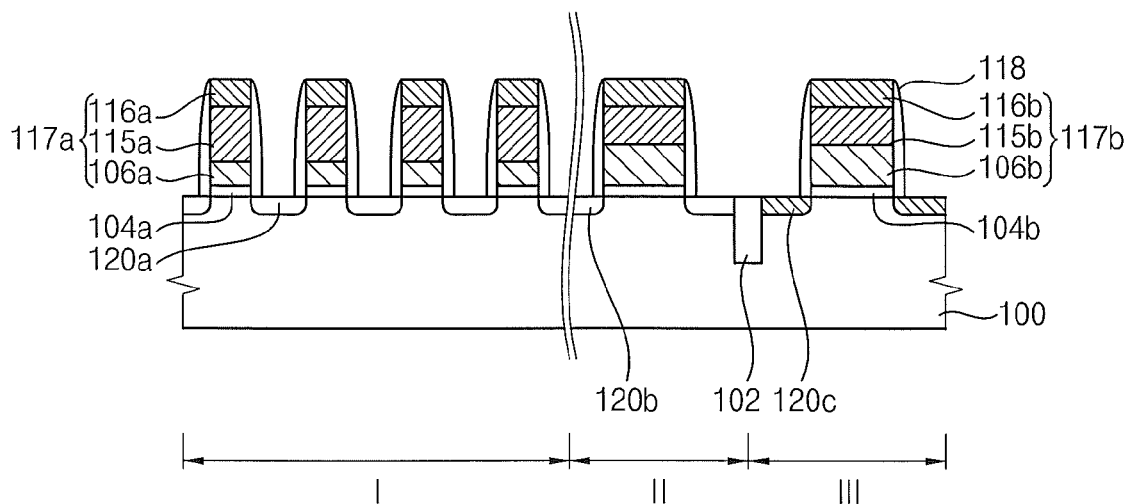

Referring to FIG. 11, a spacer layer may be formed on the substrate 100 to cover the first and second conductive structures 117a and 117b and the first and second gate insulation layer patterns 104a and 104b. The spacer layer may be etched by an anisotropic etching process to form spacers 118 on sidewalls of the first and second conductive structures 117 and 117b and the first and second gate insulation layer patterns 104a and 104b.

A fourth photoresist pattern (not shown) covering a part of the second conductive structure 117b in the third region III may be formed on the substrate 100. N-type impurities may be implanted into the substrate 100 using the fourth photoresist pattern as an ion implantation mask to form a first impurity region 120a at upper portions of the substrate 100 adjacent to the first conductive structure 117a and a second impurity region 120b at upper portions of the substrate 100 adjacent to the second conductive structure 117b in the second region II. The fourth photoresist pattern may be removed.

A fifth photoresist pattern (not shown) covering the first conductive structure 117a and a part of the second conductive structure 117b in the second region II may be formed on the substrate 100. P-type impurities may be implanted into the substrate 100 using the fifth photoresist pattern as an ion implantation mask to form a third impurity region 120c at upper portions of the substrate 100 adjacent to the second conductive structure 117b in the third region III. The fifth photoresist pattern may be removed.

As illustrated above, cell transistors including the first conductive structure 117a, the first gate insulation layer pattern 104a and the first impurity region 120a, which has a relatively small width, may be formed in the first region I. Additionally, logic transistors including the second conductive structure 117b, the second gate insulation layer pattern 104b and the second impurity region 120b (or the third impurity region 120c), which has a relatively large width, may be formed in the second region II (or the third region III).

Figure 12:
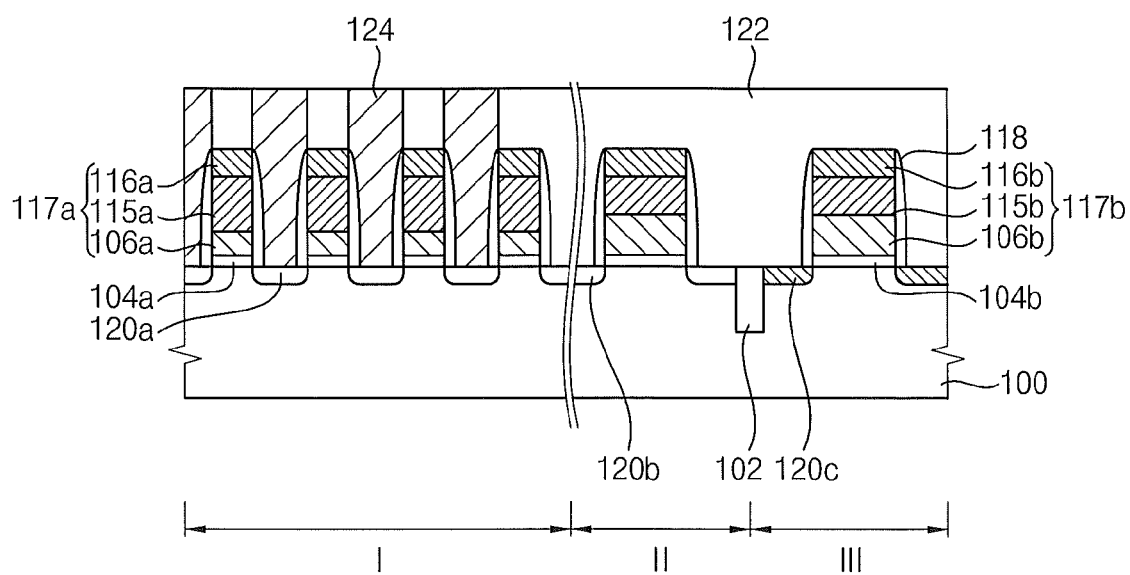

Referring to FIG. 12, an insulating interlayer 122 may be formed on the substrate 100 to cover the cell transistors and the logic transistors. An upper portion of the insulating interlayer 122 may be planarized by a CMP process and/or an etch back process.

Holes (not shown) may be formed through the insulating interlayer 122 to expose the first impurity region 120a. A conductive layer may be formed on the insulating interlayer 122 to fill the holes, and an upper portion of the conductive layer may be planarized until the insulating interlayer 122 to form contact plugs 124. The first and second conductive structures 117a and 117b may have the same height from the substrate 100, and thus forming the contact plugs 124 may be easy.

Figure 13:
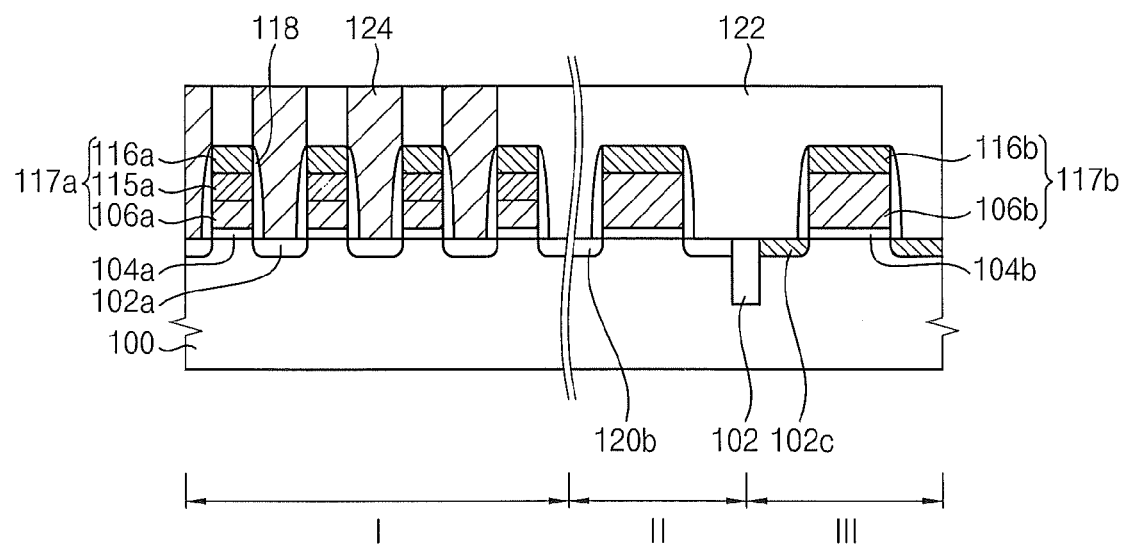
FIG. 13 is a cross-sectional view illustrating a semiconductor device in accordance with other example embodiments.

FIG. 13 is a cross-sectional view illustrating a semiconductor device in accordance with other example embodiments. The semiconductor device is substantially the same as that of FIG. 1 except for the logic transistors. Thus, detail explanations about other elements are omitted here.

Referring to FIG. 13, a substrate 100 divided into a first region I, a second region II and a third region III may be provided. Cell transistors may be formed in the first region I of the substrate 100. Logic transistors may be formed in the second and third regions II and III of the substrate 100. Each of the cell transistors may include a first gate insulation layer 104a, a first conductive structure 117a and a first impurity region 120a.

Each of the logic transistors in the second region II, that is, each of the NMOS logic transistors may include a second gate insulation layer 104b, a second conductive structure 117b and a second source/drain region 120b. Each of the logic transistors in the third region III, that is, each of the PMOS logic transistors may include a second gate insulation layer 104b, a second conductive structure 117b and a third source/drain region 120c.

The second conductive structure 117b may be formed on the second gate insulation layer 104b. The second conductive structure 117b may include a second polysilicon layer pattern 106b and a second mask 116b sequentially stacked on the second gate insulation layer 104b. That is, the second conductive structure 117b has no second conductive layer pattern 115b therein.

Spacers 118 may be formed on sidewalls of the first conductive structure 117a and the first gate insulation layer 104a. The spacers 118 may be also formed on sidewalls of the second conductive structure 117b and the second gate insulation layer 104b.

An insulating interlayer 122 covering the cell transistors and the logic transistors may be formed on the substrate 100. Contact plugs 124 contacting the first impurity region 120a may be formed through the insulating interlayer 122 in the first region I.

Figure 14:
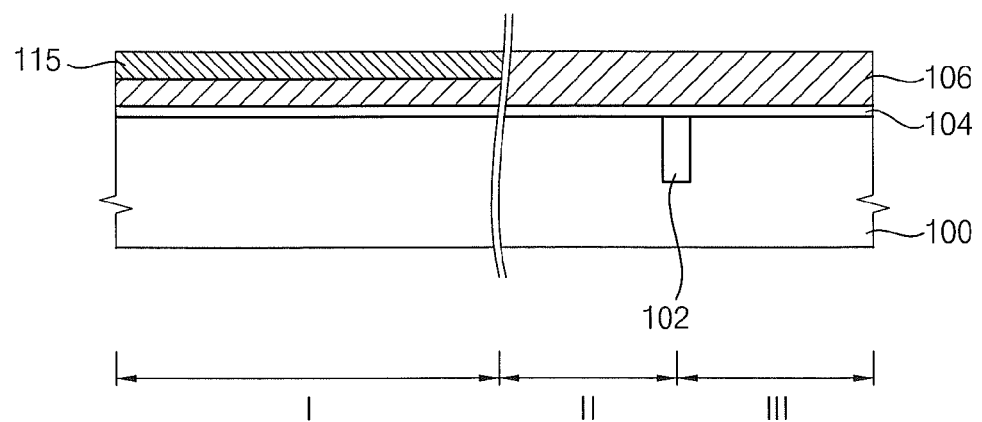
FIG. 14 is a cross-sectional view illustrating a method of manufacturing a semiconductor device in accordance with other example embodiments.

FIG. 14 is a cross-sectional view illustrating a method of manufacturing a semiconductor device in accordance with other example embodiments.

Processes substantially the same as those illustrated with reference to FIGS. 2 to 7 are performed.

Referring to FIG. 14, an upper portion of the conductive layer 115 is planarized until the polysilicon layer 106 is exposed. Thus, the conductive layer 115 remains only on a portion of the polysilicon layer 106 in the first region I.

Processes substantially the same as those illustrated with reference to FIGS. 9 to 12, so that the semiconductor device of FIG. 13 may be manufactured.

Figure 15:
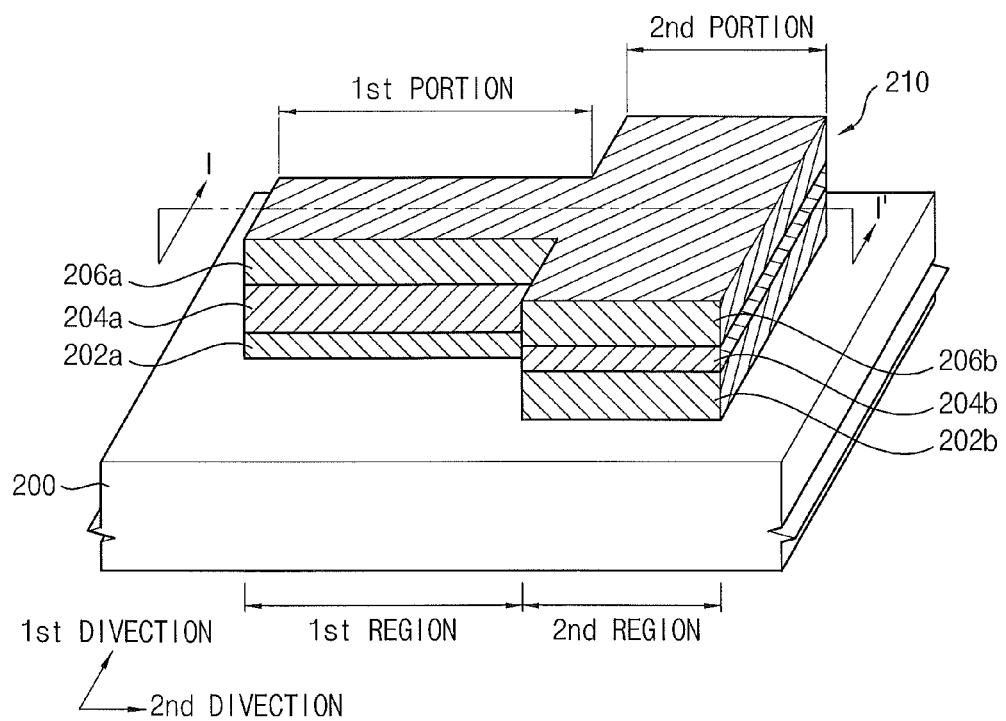
FIG. 15 is a perspective view illustrating a wiring of a semiconductor device in accordance with example embodiments.
Figure 16:
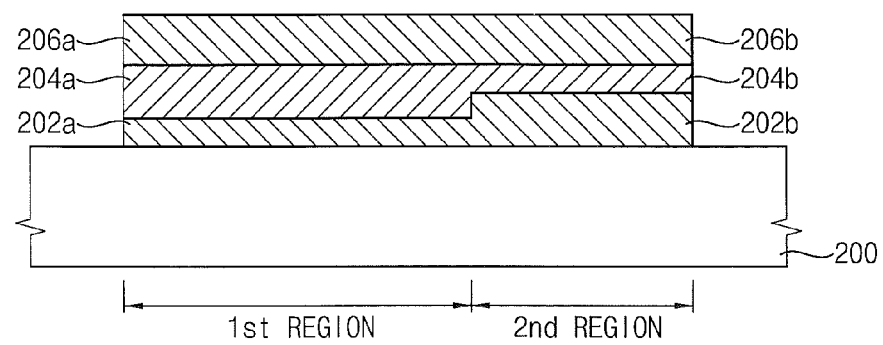
FIG. 16 is a cross-sectional view of the wiring cut along line I-I' of FIG. 15.

FIG. 15 is a perspective view illustrating a wiring of a semiconductor device in accordance with example embodiments. FIG. 16 is a cross-sectional view of the wiring cut along with the line I-I' of FIG. 15.

Referring to FIGS. 15 and 16, a substrate 200 having a structure (not shown) may be provided. The structure may include transistors, contact plugs, insulating interlayers, etc. The structure may have an even top surface.

A conductive structure 210 may be formed on the substrate 200 having the structure. The conductive structure 210 may include a first portion and a second portion. The first portion may be formed in a first region and may have a first width in a first direction, and the second portion may be formed in a second region and may have a second width in the first direction that is larger than the first width.

The first portion of the conductive structure 210 may include a first conductive layer pattern 202a, a second conductive layer pattern 204a and a first hard mask 206a. The first conductive layer pattern 202a may include polysilicon or a metal. The second conductive layer pattern 204a may have a resistance lower than that of the first conductive layer pattern 202a, and may include a metal, a metal nitride, a metal silicide, etc. For example, the second conductive layer pattern 204a may include tungsten, titanium, tantalum, tungsten silicide, titanium silicide, tantalum silicide, cobalt silicide, nickel silicide, tungsten nitride, titanium nitride, tantalum nitride, etc. These may be used alone or in combination thereof. The first hard mask 206a may include silicon nitride.

The second portion of the conductive structure 210 may include a third conductive layer pattern 202b, a fourth conductive layer pattern 204b and a second hard mask 206b. The third conductive layer pattern 202b may include a material substantially the same as that of the first conductive layer pattern 202a. The fourth conductive layer pattern 204b, may have a resistance lower than that of the third conductive layer pattern 202b, and may include a material substantially the same as that of the second conductive layer pattern 204a. The second hard mask 206b may include a material substantially the same as that of the first hard mask 206a.

The third conductive layer pattern 202b may have a thickness larger than that of the first conductive layer pattern 202a. The fourth conductive layer pattern 204b may have a thickness smaller than that of the second conductive layer pattern 204a. A top surface of the fourth conductive layer pattern 204b may have a height substantially the same as that of the second conductive layer pattern 204a. The first and second hard masks 206a and 206b may have the same height.

As illustrated above, in the first portion of the conductive structure 210 having a smaller width, the second conductive layer pattern 204a having a low resistance may have a relatively large thickness, and in the second portion of the conductive structure 210 having a larger width, the fourth conductive layer pattern 204b having a low resistance may have a relatively small thickness.

Figure 17:
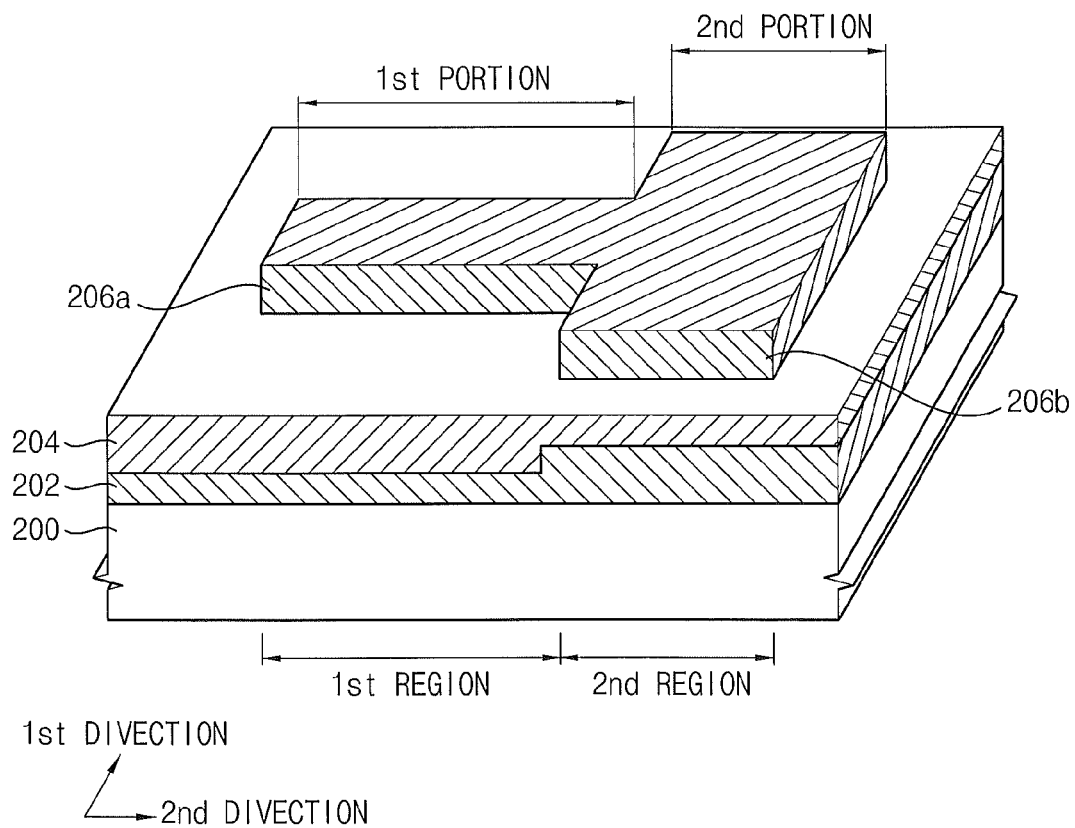
FIG. 17 is a perspective view illustrating a method of manufacturing the wiring of the semiconductor device of FIG. 15.

FIG. 17 is a perspective view illustrating a method of manufacturing the wiring of the semiconductor device of FIG. 15.

Referring to FIG. 17, a substrate 200 having a structure (not shown) may be provided. The substrate 200 may have a first region and a second region. A first portion of a conductive structure 210 (see FIG. 15) having a first width in a first direction may be formed in the first region, and a second portion of the conductive structure 210 having a second width in the first direction, which is larger than the first width, may be formed in the second region.

A first conductive layer 202 may be formed on the substrate 200. The first conductive layer 202 may be formed using polysilicon or a metal. An upper portion of the first conductive layer 202 in the first region may be removed, and thus the first conductive layer 202 may have a thickness different from each other in the first and second regions. In example embodiments, processes substantially the same as those illustrated with reference to FIGS. 5 and 6 may be performed so that the first conductive layer 202 may have the above thickness. That is, impurities may be implanted into the upper portion of the first conductive layer 202 in the first region, so that the upper portion may be damaged. A wet etching process may be performed on the first conductive layer 202 to remove the damaged upper portion of the first conductive layer 202.

A second conductive layer 204 having a resistance smaller than that of the first conductive layer 202 may be formed on the first conductive layer 202. An upper portion of the second conductive layer 204 may be planarized. Thus, a portion of the second conductive layer 204 in the first region may have a thickness larger than that of a portion of the second conductive layer 204 in the second region.

A first hard mask 206a and a second hard mask 206b may be formed on the second conductive layer 204. The first hard mask 206a may be formed in the first region and may have a first width in the first direction, and the second hard mask 206b may be formed in the second region and may have a second width in the first direction, which is larger than the first width. The first and second hard masks 206a and 206b may contact each other.

The second and first conductive layers 204 and 202 may be patterned using the first and second hard masks 206a and 206b to form the wiring of FIG. 15.

According to example embodiments, a conductive layer pattern having a low resistance may have a relatively large thickness in a portion of a conductive structure that has a relatively small width, so that the conductive structure may have a small resistance totally. Thus, a semiconductor device having the conductive structure may have a high operation speed as well as a high integration degree.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device, comprising:
  a first conductive structure including a first underlying conductive layer pattern and a first conductive layer pattern in a first region of a substrate; and
  a second conductive structure including a second underlying conductive layer pattern and a second conductive layer pattern in a second region of the substrate, the second conductive layer pattern having a material substantially the same as that of the first conductive layer pattern and having a thickness smaller than that of the first conductive layer pattern, wherein the first conductive structure has a width smaller than that of the second conductive structure, wherein the first underlying conductive layer pattern has a thickness smaller than that of the second underlying conductive layer pattern.

2. The semiconductor device of claim 1, wherein the first and second conductive layer patterns include at least one of W, Ti, Ta, $WSi_2$, $TiSi_2$, $TaSi_2$, $CoSi_2$, $NiSi_2$, WN, TiN and TaN.

3. The semiconductor device of claim 1, wherein the second underlying conductive layer pattern has a material substantially the same as that of the first underlying conductive layer pattern.

4. The semiconductor device of claim 3, wherein the first and second underlying conductive layer patterns include doped polysilicon.

5. The semiconductor device of claim 1, wherein the first conductive structure further includes a first hard mask on the first conductive layer pattern and the second conductive structure further includes a second hard mask on the second conductive layer pattern.

6. The semiconductor device of claim 1, further comprising an insulation layer between the substrate and the first conductive structure.

7. A semiconductor device, comprising:
  a first conductive structure including a first underlying conductive layer pattern and a first conductive layer pattern in a first region of a substrate; and
  a second conductive structure including a second underlying conductive layer pattern and a second conductive layer pattern in a second region of the substrate, the second conductive layer pattern having a material substantially the same as that of the first conductive layer pattern and having a thickness smaller than that of the first conductive layer pattern, wherein the first region is a memory cell region in which memory cells are formed and the second region is a peripheral circuit region in which peripheral circuits are formed, wherein the first conductive structure has a width smaller than that of the second conductive structure.

8. The semiconductor device of claim 7, wherein the peripheral circuit region includes an NMOS region in which an NMOS transistor is formed and a PMOS region in which a PMOS transistor is formed.

9. A semiconductor device, comprising:
  a first conductive structure including a first underlying conductive layer pattern and a first conductive layer pattern in a first region of a substrate; and
  a second conductive structure including a second underlying conductive layer pattern and a second conductive layer pattern in a second region of the substrate, the second conductive layer pattern having a material substantially the same as that of the first conductive layer pattern and having a thickness smaller than that of the first conductive layer pattern, wherein the first conductive layer pattern has a resistance smaller than that of the first underlying conductive layer pattern and the second conductive layer pattern has a resistance smaller than that of the second underlying conductive layer pattern, wherein the first conductive structure has a width smaller than that of the second conductive structure.

10. The semiconductor device of claim 9, wherein the first underlying conductive layer pattern has a thickness smaller than that of the second underlying conductive layer pattern.

11. The semiconductor device of claim 9, wherein the first conductive structure further includes a first hard mask on the first conductive layer pattern and the second conductive structure further includes a second hard mask on the second conductive layer pattern.

* * * * *